(12) United States Patent
Bash et al.

(10) Patent No.: US 8,794,017 B2
(45) Date of Patent: Aug. 5, 2014

(54) COOLING MEDIUM DISTRIBUTION THROUGH A NETWORK OF PASSAGES HAVING A PLURALITY OF ACTUATORS

(75) Inventors: Cullen E. Bash, Los Gatos, CA (US); Chandrakant Patel, Fremont, CA (US); Ratnesh Kumar Sharma, Union City, CA (US); Amip J. Shah, Santa Clara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 689 days.

(21) Appl. No.: 13/000,012

(22) PCT Filed: Jun. 30, 2008

(86) PCT No.: PCT/US2008/068788
§ 371 (c)(1),
(2), (4) Date: Dec. 17, 2010

(87) PCT Pub. No.: WO2010/002388
PCT Pub. Date: Jan. 7, 2010

(65) Prior Publication Data
US 2011/0112694 A1    May 12, 2011

(51) Int. Cl.
*G05D 23/00* (2006.01)

(52) U.S. Cl.
USPC .......................................................... 62/132

(58) Field of Classification Search
USPC .......................................... 700/277; 62/132
See application file for complete search history.

(56) References Cited

U.S. PATENT DOCUMENTS

| | | | |
|---|---|---|---|
| 6,574,104 B2 * | 6/2003 | Patel et al. | 361/695 |
| 6,732,540 B2 * | 5/2004 | Sugihara et al. | 62/177 |
| 7,013,968 B2 | 3/2006 | Beitelmal et al. | |
| 7,315,448 B1 | 1/2008 | Bash et al. | |
| 7,730,731 B1 | 6/2010 | Bash et al. | |
| 2003/0158718 A1 * | 8/2003 | Nakagawa et al. | 703/13 |
| 2003/0193777 A1 * | 10/2003 | Friedrich et al. | 361/687 |

(Continued)

FOREIGN PATENT DOCUMENTS

| | | |
|---|---|---|
| JP | 06123512 | 5/1994 |
| JP | 07004717 | 5/1994 |
| JP | 2004020191 | 1/2004 |
| WO | WO-2009114017 | 9/2009 |

OTHER PUBLICATIONS

Chandrakant D. Patel, Cullen E. Bash, et al. Smart cooling of data centers. In Proceedings of the Pacific Rim/ASME International Electronic Packaging Technical Conference and Exhibition (IPACK), Jul. 2003.*

(Continued)

*Primary Examiner* — Justin M Pats
*Assistant Examiner* — Venay Puri (57) ABSTRACT

A system for managing distribution of a cooling medium includes a sensor configured to detect a condition, a first agent configured to receive the detected condition and to determine whether a characteristic of the cooling medium controlled via a first actuator is to be manipulated based upon the detected condition. The system also includes a second agent configured to receive at least one of the detected condition and the flow manipulation determination of the first actuator and to determine whether a characteristic of the cooling medium controlled by a second actuator is to be manipulated based upon the at least one of the detected condition and the characteristic manipulation determination of the first actuator.

13 Claims, 6 Drawing Sheets

(56) References Cited

U.S. PATENT DOCUMENTS

| | | | |
|---|---|---|---|
| 2006/0184935 A1* | 8/2006 | Abels et al. | 718/1 |
| 2006/0272342 A1 | 12/2006 | Bash et al. | |
| 2007/0078635 A1* | 4/2007 | Rasmussen et al. | 703/1 |
| 2007/0162584 A1* | 7/2007 | Kokusho et al. | 709/223 |
| 2007/0183129 A1* | 8/2007 | Lewis et al. | 361/724 |
| 2009/0078401 A1* | 3/2009 | Cichanowicz | 165/299 |
| 2009/0201293 A1* | 8/2009 | Tung et al. | 345/440 |
| 2009/0302124 A1* | 12/2009 | Dawson et al. | 236/49.3 |
| 2010/0010678 A1* | 1/2010 | Dawson et al. | 700/276 |
| 2011/0238236 A1* | 9/2011 | Tozer et al. | 700/300 |

OTHER PUBLICATIONS

Chandrakant D. Patel et al.; Energy Flow in the Information Technology Stack: Coefficient of Performance of the Ensemble and its Impact on the Total Cost of Ownership; HP Laboratories Palo Alto: HPL-2006-55: Mar. 21, 2006.

Bash et al., U.S. Appl. No. 11/142,556, filed Jun. 1, 2005.

PCT/US2008/068788 ISR dated Jan. 23, 2009.

\* cited by examiner

COOLING MEDIUM DISTRIBUTION THROUGH A NETWORK OF PASSAGES HAVING A PLURALITY OF ACTUATORS

CROSS-REFERENCES

The present application has the same Assignee and shares some common subject matter with U.S. patent application Ser. No. 11/142,558, entitled "Refrigeration System with Parallel Evaporators and Variable Speed Compressor", filed on Jun. 1, 2005, U.S. patent application Ser. No. 11/142,557, entitled "Air-Cooled Heat Generating Device Airflow Control System", filed on Jun. 1, 2005, U.S. patent application Ser. No. 11/142,556, entitled "Air-Cooled Device Refrigeration System with Parallel Evaporators", filed on Jun. 1, 2005, U.S. patent application Ser. No. 11/264,773, entitled "Refrigeration System with Serial Evaporators", filed on Nov. 1, 2005, and PCT Application Serial No. US08/57040, entitled "Exergy-Based Evaluation of an Infrastructure", filed on Mar. 14, 2008. The disclosures of the above-listed applications are incorporated by reference in their entireties.

BACKGROUND

A data center may be defined as a location, for instance, a room that houses computer systems arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation. As such, the computer systems often consume a great deal of energy in performing various computing functions.

To cool the computer systems, hydronics systems within the data centers have been used to distribute chilled water from a chiller plant to individual computer room air conditioning (CRAC) units contained in the data centers. CRAC units that rely upon hydronics systems typically function to cool airflow circulating through the data centers by causing heat from the airflow to be conveyed to the chilled water. In addition, the computer systems draw in the cooled airflow and are cooled through the exchange of heat with the cooled airflow. The CRAC units receive the heated airflow and repeat the cooling process to substantially continuously cool the computer systems.

While the use of hydronics systems in this manner has been found to be relatively robust and flexible, there are some limitations on the amount of heat the CRAC units are capable of removing at the rack level. It would therefore be beneficial to be able to utilize hydronics systems that afford greater control over the provisioning of cooling at multiple levels within a structure.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a system and method of managing distribution of a cooling medium to multiple areas of a structure through a network of passages having a plurality of valves positioned along the network of passages. The cooling fluid flow supplied to various areas in the network of passages may be controlled by a plurality of hierarchically arranged agents. The agents are considered as being hierarchically arranged because agents positioned at higher levels in the hierarchy are configured to make cooling medium characteristic adjustment decisions based upon adjustments made by agents positioned at lower levels in the hierarchy. The agents are configured to control one or more cooling medium characteristics, such as, flow rate, temperature, pressure, etc. supplied to the various branches in the network of passages.

Through implementation of the system and method disclosed herein, each of the actuators that control the cooling medium characteristic(s) may be controlled as part of a larger control architecture to thus achieve a predefined goal. In addition, the actuator manipulation decisions may be changed in a relatively easy manner in response to changes in the predefined goal.

Figure 1:
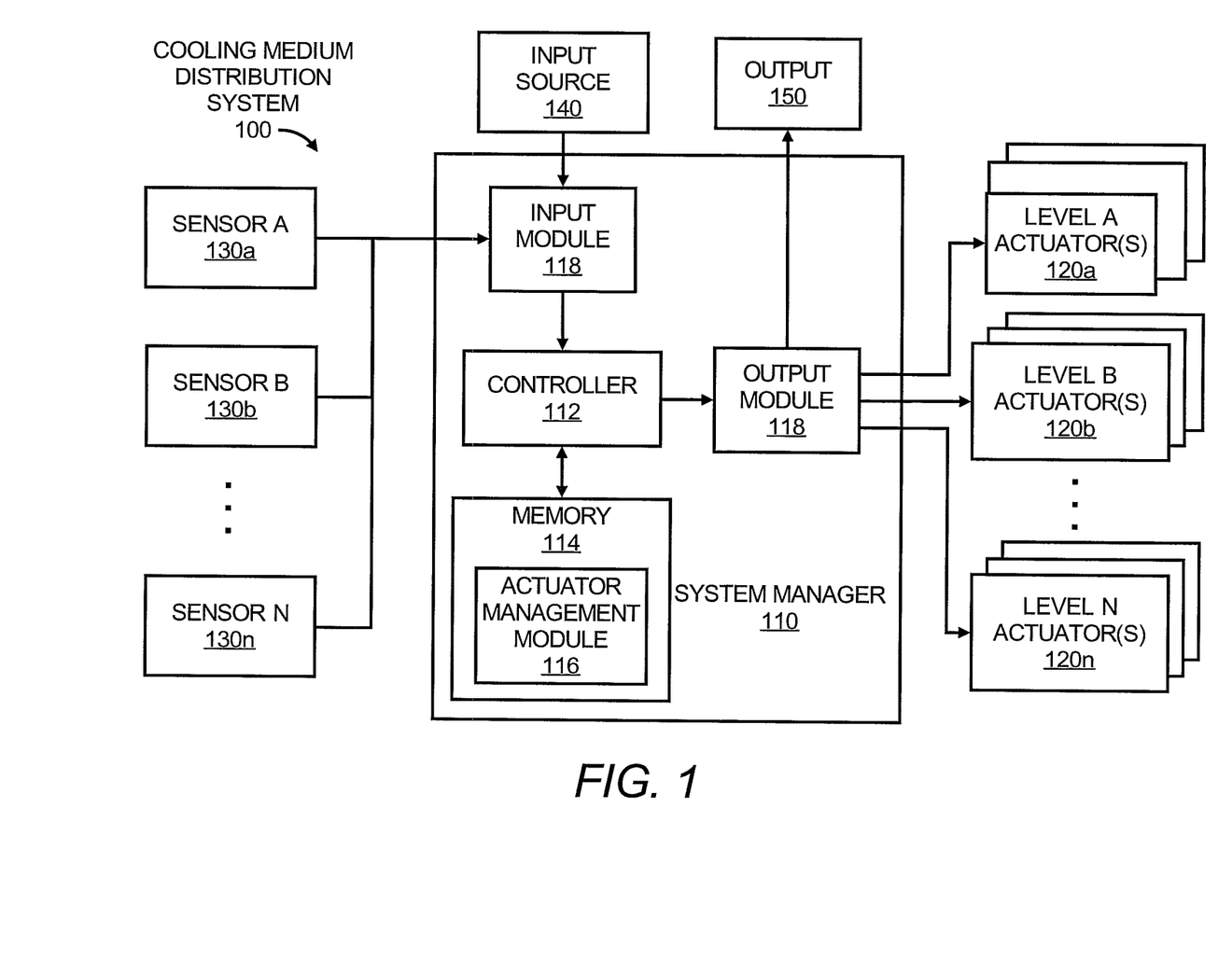
FIG. 1 shows a block diagram of a system for managing distribution of a cooling medium to multiple areas of a structure through a network of passages having a plurality of actuators positioned along the network of passages, according to an embodiment of the invention.

With reference first to FIG. 1, there is shown a block diagram of a system 100 for managing distribution of a cooling medium to multiple areas of a structure through a network of passages having a plurality of actuators positioned along the network of passages, according to an example. It should be understood that the following description of the block diagram is but one manner of a variety of different manners in which such a cooling medium distribution system 100 may be configured. In addition, it should be understood that the cooling medium distribution system 100 may include additional components and that some of the components described herein may be removed and/or modified without departing from a scope of the cooling medium distribution system 100.

According to an example, the cooling medium distribution system 100 is configured to manage the distribution of a cooling medium to one or more structures 202a-202n (FIG. 2), where "n" is an integer equal to or greater than one. In addition, or alternatively, the cooling medium distribution system 100 is configured to control the distribution of the cooling medium to various locations within the one or more structures 202a-202n.

Figure 2:
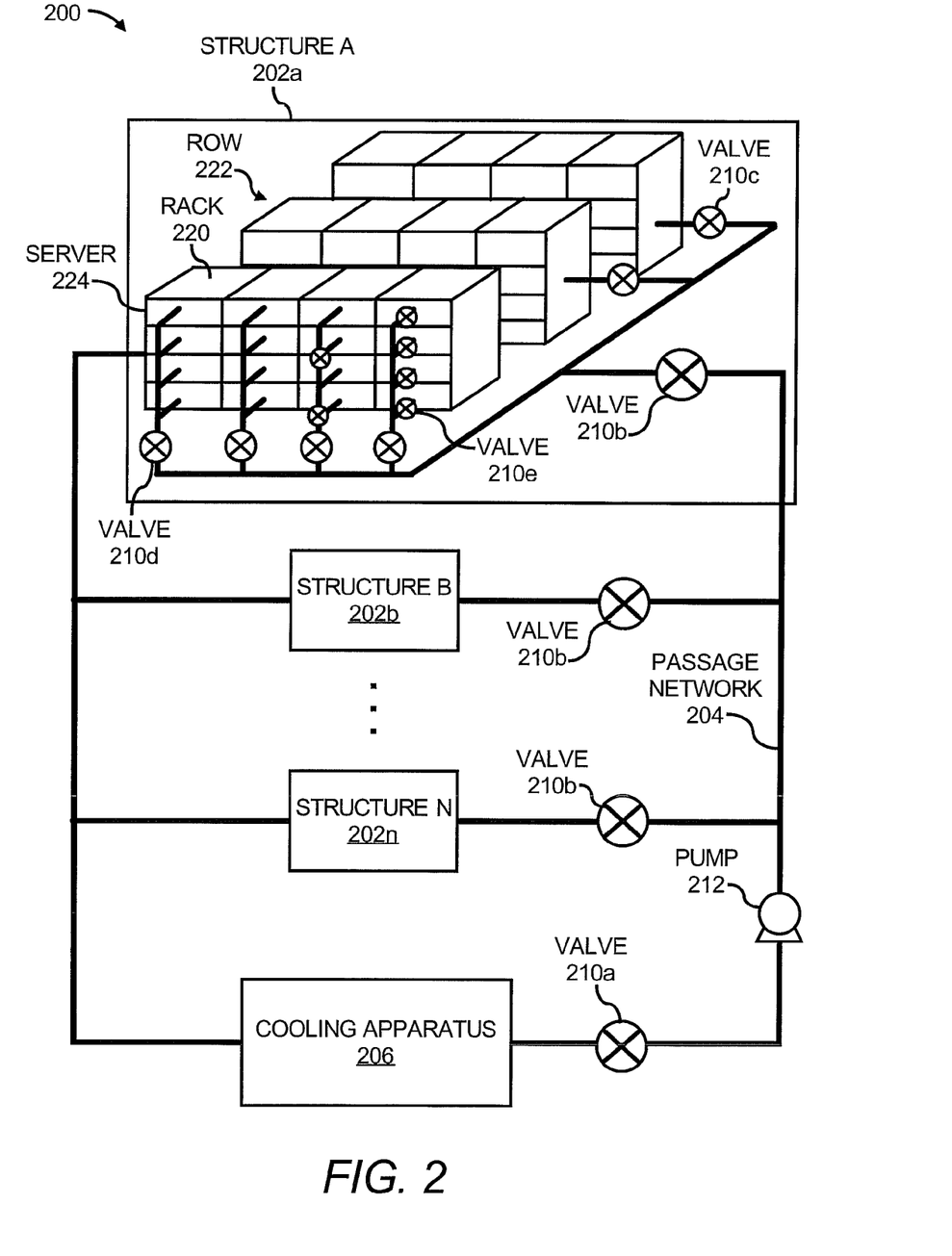
FIG. 2 shows a simplified schematic diagram of a plurality of structures through which a network of passages extends, according to an embodiment of the invention.

As shown in FIG. 2, which depicts a simplified schematic diagram 200 of a plurality of structures 202a-202n, according to an example, the cooling medium is distributed to multiple areas in at least one structure 202a-202n through a network of passages 204. The passages 204 may comprise, for instance, one or more of conduits, pipes, ducts, channels, tubes, etc. The network of passages 204 is depicted as forming a loop through which cooling medium flows, such as, a hydronics loop. The network of passages 204 may include one or more pumps 212 configured to pressurize the cooling medium and thereby cause the cooling medium to flow in a desired direction through the network of passages 204. The cooling medium may comprise, for instance, chilled water, refrigerant, water at reduced pressure, or other reasonably suitable medium that may be employed to absorb heat from one location and convey the heat to another location.

In any regard, the network of passages 204 generally enables the cooling medium to flow through the structures 202a-202n and absorb heat generated by the components, such as, servers, monitors, hard drives, power supplies, network switches, etc., contained in the structures 202a-202n. The network of passages 204 is also configured to interact with a cooling apparatus 206 that operates to remove heat from the cooling medium and thus reduce the temperature of the cooling medium before being supplied back into the structures 202a-202n. The cooling apparatus 206 may comprise any reasonably suitable mechanism or system designed to cool the cooling medium. Examples of suitable cooling apparatuses 206 include, for instance, refrigeration loops, air-to-liquid heat exchangers, liquid-to-liquid heat exchangers, etc.

Figure 3:
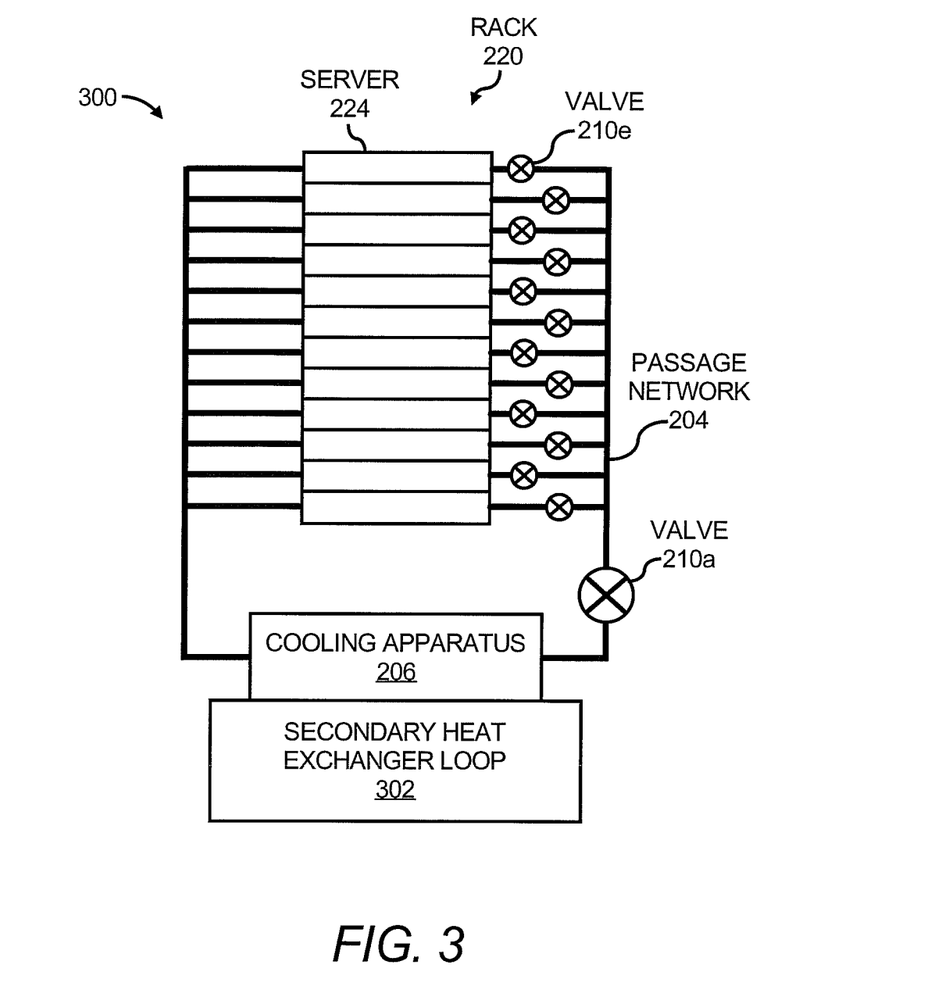
FIG. 3 shows a simplified schematic diagram of a rack that contains a plurality of servers and a network of passages extending through the servers, according to an embodiment of the invention.

In instances where the cooling apparatus 206 comprises a refrigeration system, the cooling apparatus 206 may include a compressor, condenser, and an expansion valve configured to directly cool the cooling medium. In other instances, the cooling apparatus 206 may comprise a heat exchanger through which heat is transferred from the cooling medium to a second cooling medium in a secondary heat exchanger loop 302 (FIG. 3). In the latter instances, the secondary heat exchanger loop 302 may itself comprise a refrigeration loop, a water-chiller apparatus, etc., having a heat exchanger through which heat is transferred from the cooling medium in the cooling apparatus 206 to the cooling medium in the secondary heat exchanger loop 302.

As further depicted in FIG. 2, the cooling medium flow through the network of passages 204 is controlled by a plurality of valves 210a-210n, where "n" is an integer equal to or greater than one and does not necessarily equal other values of "n" cited throughout the present disclosure. In addition, the valves 210a-210n may be manipulated by actuators 120a-120n (FIG. 1), which may each be configured to manipulate flow through one or more valves 210a-210n. Furthermore, the valves 210a-210n may comprise two-way valves, three-valves, or other multiple input/output valves. Thus, for instance, each of the actuators 120a-120n may be configured to control cooling medium flow through a single passage or through a plurality of passages. In addition, some or all of the actuators 120a-120n may be configured to control either or both of temperature and fluid flow through the valves 210a-210n that comprise, for instance, three-way valves.

The valves 210a-210n are further depicted as being configured to manipulate the cooling medium flow at multiple levels of passages. For instance, a first level valve 210a is configured to control the cooling medium flow at the highest level since the first level valve 210a controls the cooling medium flow to or from a plurality of structures 202a-202n or a zone. Second level valves 210b are configured to control the cooling medium flow at a second highest level, such as, to or from individual structures 202a-202n. Third level valves 210c are configured to control cooling medium flow at a third highest level, such as, to or from rows of racks contained in respective structures 202a-202n. Fourth level valves 210d are configured to control cooling medium flow at a fourth highest level, such as, to or from individual racks. Fifth level valves 210e are configured to control cooling medium flow at a fifth highest level, such as, to or from individual servers. Additional level valves 210f-210n (not shown) may also be configured to control cooling medium flow, for instance, to cool individual components in the servers. According to a particular example, the fifth level valves 210e that supply cooling medium to the servers may comprise three-way valves, while the remaining valves 210a-210d comprise two-way valves.

According to another example, one or more of the valves 210a-210n may be replaced with one or more pumps 212 configured to vary the flow rate/pressure of the cooling medium supplied to various areas in the structures 202a.

As further shown in FIG. 2, the structure 202a labeled "A" includes a plurality of racks 220 arranged in rows 222. The racks 220 house a plurality of servers 224, which may comprise standard horizontally mounted servers and/or blade servers. The structures 202b-202n may have configurations similar to the configuration shown with respect to the structure 202a.

The structures 202a-202n may additionally comprise, for instance, relatively large structures, such as, single-story buildings, multi-story buildings, rooms in a building, IT data centers, etc. The structures 202a-202n may further comprise relatively smaller structures, such as, an electronics cabinet housing a plurality of electronic components, such as, servers, memories, power supplies, switches, etc.

With particular reference to FIG. 3, there is shown a simplified schematic diagram 300 of a rack 220 that contains a plurality of servers 224 and the network of passages 204 extending through the servers 224, according to an example. Although not explicitly shown, the valves 210a and 210e may be controlled to enable the cooling medium to flow in either a clockwise or a counterclockwise direction in the network of passages 204.

Various examples of suitable configurations in which cooling medium flow is supplied to racks 220 and servers 224 may be found in commonly assigned U.S. patent application Ser. No. 11/142,558, entitled "Refrigeration System with Parallel Evaporators and Variable Speed Compressor", filed on Jun. 1, 2005, U.S. patent application Ser. No. 11/142,557, entitled "Air-Cooled Heat Generating Device Airflow Control System", filed on Jun. 1, 2005, U.S. patent application Ser. No. 11/142,556, entitled "Air-Cooled Device Refrigeration System with Parallel Evaporators", filed on Jun. 1, 2005, U.S. patent application Ser. No. 11/264,773, entitled "Refrigeration System with Serial Evaporators", filed on Nov. 1, 2005. The disclosures of the above-listed applications are incorporated by reference in their entireties.

In addition, or alternatively, the network of passages 204 may be configured to cool airflow that passes through other components of the structures 202a-202n, such as, air conditioning units, ventilation tiles, etc. In one example, therefore, various locations of the network of passages 204, such as, those locations where heat transfer is desired, may include fins operable to increase the transfer of heat from a surrounding area to the cooling medium. In another example, various locations of the network of passages 204 may include cold plates or evaporators, such as, those locations configured to contact apparatuses from which heat removal is desired. In a further example, the network of passages 204 may be connected to an accumulator that stores additional chilled cooling medium that may be introduced into the network of passages 204 during, for instance, cooling demand surges, loss of cooling fluid, etc.

In any regard, as discussed in greater detail herein below, the actuators 120a-120n are controlled to thereby vary at least one characteristic of cooling medium supplied through respective valves 210a-210d and/or respective pumps 212. One or more characteristics of the cooling medium supplied to multiple areas in one or more of the structures 202a-202n may thus be manipulated according to one or more control schemes designed to achieve one or more predetermined goals.

With reference back to FIG. 1, the cooling medium distribution system 100 is depicted as including a system manager 110, which generally comprises a computing device configured to perform various functions in the cooling medium distribution system 100. The system manger 110 includes a controller 112, which may comprise a microprocessor, a micro-controller, an application specific integrated circuit (ASIC), and the like, configured to perform various processing functions. In addition, or alternatively, the controller 112 may comprise software operating in any of a number of computing devices.

The system manager 110 may comprise a computing device and the controller 112 may comprise a microprocessor of the computing device. The controller 112 accesses a memory 114 configured to store software or algorithms that provide the functionality of the controller 112. In this regard, the memory 114 may comprise, for instance, volatile or non-volatile memory, such as DRAM, EEPROM, MRAM, flash memory, floppy disk, a CD-ROM, a DVD-ROM, or other optical or magnetic media, and the like.

The memory 114 includes an actuator management module 116, which the controller 112 is configured to invoke or implement in managing a plurality of actuators 120a-120n. The actuator management module 116 comprises software, hardware, or a combination thereof designed to identify which of the actuators 120a-120n is/are to be modulated in response to conditions detected by one or more sensors 130a-130n, where "n" is an integer equal to or greater than one and does not necessarily equal other values of "n" cited throughout the present disclosure, and whether at least one predefined goal is substantially being met. The actuator management module 116 is also configured to identify which of the actuators 120a-120n is/are to be modulated based upon one or more control schemes configured to meet the at least one predefined goal, such as, meeting provisions set forth in a service level agreement (SLA), total cost of ownership (TCO) goals, energy reduction goals, exergy reduction goals, thermal management goals, etc.

According to a particular example, the actuator management module 116, when implemented or invoked, is configured to determine which of the actuators 120a-120n should be modulated to substantially maintain temperatures detected by the sensors 130a-130n within one or more predetermined temperature ranges, while substantially minimizing the amount of energy consumed in cooling the cooling medium.

According to another example, the actuator management module 116 is composed of a plurality of agents 410a-410n (FIG. 4), where "n" is an integer greater than or equal to one and does not necessarily equal other instances of "n" cited throughout the present disclosure, configured to govern control of respective valve actuators 120a-120n. In another example, the agents 410a-410n may comprise separate elements, such as, separate controllers 112, stored or housed in multiple system managers 110 or other computing devices. In any regard, the agents 410a-410n may be defined as elements or entities that perceive their environment through sensors 130a-130n and that are configured to manage that environment through actuators, such as, the actuators 120a-120n, cooling apparatus 206 components, etc., either in a collaborative or autonomous manner to achieve predefined goals. In addition, the agents 410a-410n may comprise software and/or hardware modules that are configured to govern control of the respective actuators in various manners to achieve the predefined goals.

Figure 4:
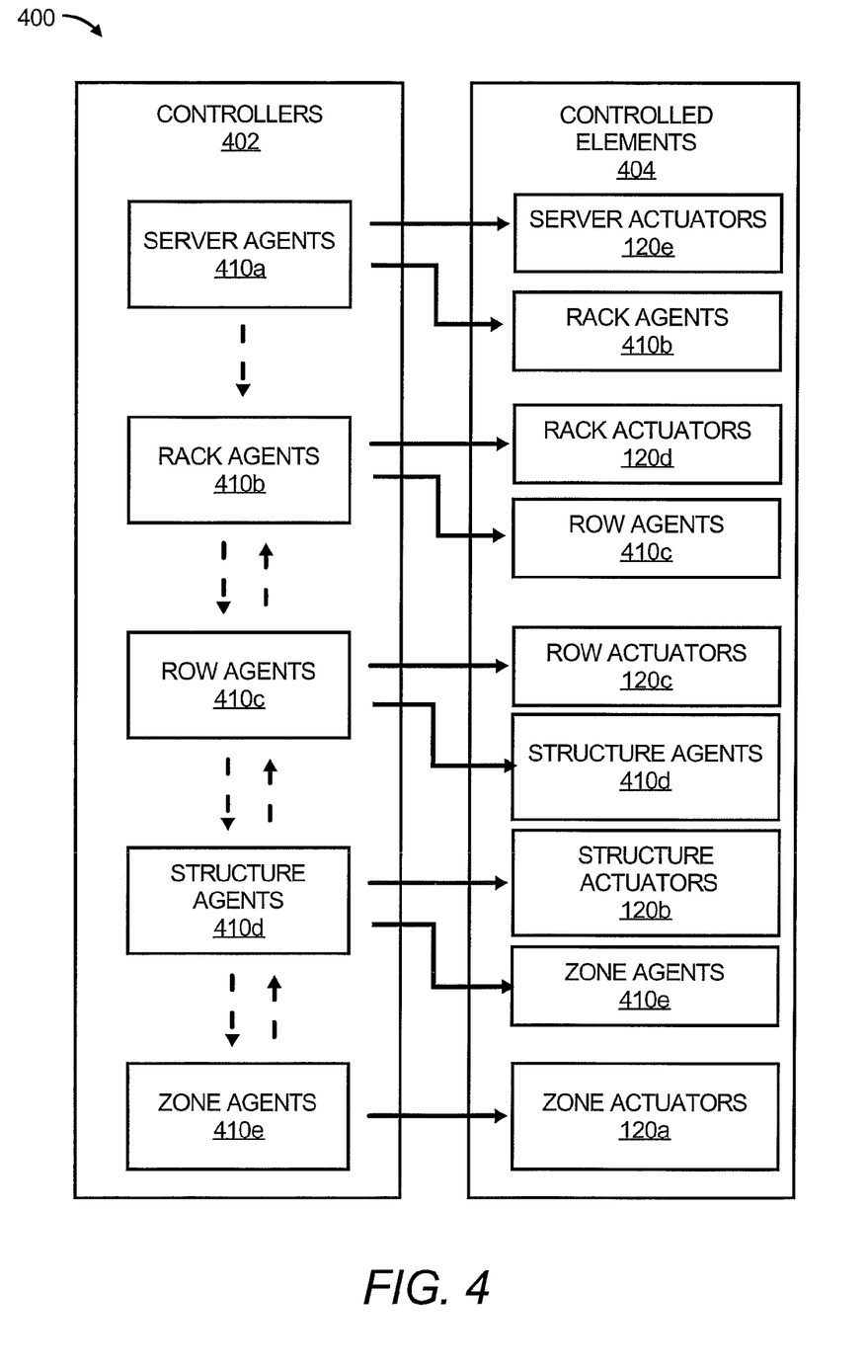
FIG. 4 shows a diagram of interactions between agents and valves, according to an embodiment of the invention.

The agents 410a-410n may be arranged in a hierarchical manner, for instance, as shown in the diagram 400 depicted in FIG. 4. In other words, the agents 410a-410n may be arranged to serve varying levels of valves 210a-210n and/or pumps 212. In this regard, one or more server agents 410a may be associated with one or more server actuators 120e, one or more rack agents 410b may be associated with one or more rack actuators 120d, one or more row agents 410c may be associated with one or more row actuators 120c, one or more structure agents 410d may be associated with one or more structure actuators 120b, one or more zone agents 410e may be associated with one or more zone actuators 120a, etc.

As shown in the diagram 400, the agents 410a-410e comprise controllers 402 for a plurality of controlled elements 404. The controlled elements 404 are depicted as including the actuators 120a-120n, as well as the agents 410b-410e. The controllers 402 may include additional agents and the controlled elements may include additional actuators not shown in FIG. 4. In addition, the dashed arrows in FIG. 4 represent the flow of information and the solid arrows represent the flow of control signals. The control signals may include, for instance, data pertaining to the control instructions sent from an agent 410a-410n to a respective actuator 120a-120n.

As discussed above, the agents 410a-410e may receive environmental condition information from one or more sensors 130a-130n positioned in their respective regions of control. In addition, a plurality of agents 410a-410e may receive condition information from one or more of the same sensors 130a-130n. Moreover, the sensors 130a-130n may be configured to detect one or more conditions, such as, temperature, pressure, humidity, mass flow rate of the cooling medium, mass flow rate of airflow through a structure 202a, power states, processor states, etc.

The sensors 130a-130n interface with the system manager 110 through an input module 118 and may be positioned at various locations throughout the structures 202a-202n, for instance, at those locations where control over at least one condition, such as, temperature, pressure, mass flow rate, etc., is desired. By way of particular example, the structures 202a-202n comprise IT data centers housing a plurality of racks 220. In this example, a plurality of sensors 130a-130n are positioned at the inlets of some or all of the racks 220 and the valve management module 116 may use the data collected by the sensors 130a-130n to modulate one or more of the actuators 120a-120n associated with the valves 210a-210n/pumps 212 in an effort to substantially maintain temperatures at the inlets of the racks 220 within predetermined temperature ranges.

The server agents 410a are configured to insure, for instance, that server level thermal requirements, such as, server air temperature for liquid to air heat exchangers, component temperatures for cold plates, etc., are substantially maintained. In this regard, the server agents 410a are configured to receive sensed condition data from sensors 130a-130n configured to detect, for instance, server air temperatures, component temperatures, server air volume flow rates, pressure drops across servers, power states of servers, processor power states, etc. Based substantially upon the data received from the sensors 130a-130n and at least one predefined goal, the server agents 410a are configured to determine how the server actuators 120e are to be actuated to achieve or maintain the at least one predefined goal.

The rack agents 410b are configured to insure, for instance, that rack level flow requirements are met based upon information received from the server agents 410a. The flow of information and control signals from the server agents 410a to the rack agents 410b is depicted in FIG. 4. In addition, the rack agents 410b are configured to determine how the rack actuators 120d are to be actuated to achieve or maintain at least one predefined goal based on the information received from the server agents 410a.

The row agents 410c are configured to insure, for instance, that row level flow requirements are met based on information received from rack agents 410b. The flow of information and control signals from the rack agents 410b to the row agents 410c is depicted in FIG. 4. In addition, the row agents 410c are configured to determine how the row actuators 120c are to be actuated to achieve or maintain at least one predefined goal based on the information received from the rack agents 410b.

The structure agents 410d are configured to insure, for instance, that structure level fluid flow and fluid temperature requirements are met based on information from row agents 410c. The flow of information and control signals from the row agents 410c to the structure agents 410d is depicted in FIG. 4. In addition, the structure agents 410d are configured to determine how the structure actuators 120b are to be actuated to achieve or maintain at least one predefined goal based on the information received from the row agents 410c.

The zone agents 410e are configured to insure, for instance, that the flow and temperature of cooling medium supplied to one or more structures 202a-202n are within desired ranges based upon information received from the structure agents 410d. The flow of information and control signals from the structure agents 410d to the zone agents 410e is depicted in FIG. 4. In addition, the zone agents 410e are configured to determine how the zone actuators 120a are to be actuated to achieve or maintain at least one predefined goal based on the information received from the structure agents 410d.

As FIG. 4 illustrates, the agents 410a-410n at higher levels are configured to manage their respective valves 210a-210e/ pumps 212 based upon operational changes made by agents 410a-410n in lower levels of the hierarchy. In one regard, the hierarchical control structure generally enables customizable control over conditions at multiple areas in multiple structures 202a-202n.

In addition, or alternatively, one or more of the agents 410a-410n at the lower levels in the hierarchy may supply data to agents 410a-410n at levels higher than immediately adjacent higher levels. As such, for instance, the server agents 410a may supply data to the row agents 410c and/or the structure agents 410d. Likewise, the agents 410a-410n at the higher levels may utilize the data received from the agents 410a-410n lower level in controlling the actuators 120a-120n.

Each of the different levels of agents 410a-410n may have the same or differing predefined goals. In addition, or alternatively, agents within the same level may have the same or differing goals. For instance, agents associated with servers 224 selected to perform relatively less critical operations and/or racks 220 containing those servers 224 may be programmed to conserve energy while potentially sacrificing uptime. In contrast, agents associated with servers 224 selected to perform relatively more critical operations and/or racks 220 containing those servers 224 may be programmed to maintain conditions within a tighter range to thereby maximize uptime, while requiring relatively greater energy consumption.

With reference back to FIG. 1, the agents 410a-410n may receive the predefined goals from an input source 140, which may comprise a computing device that a user may implement in inputting data into the system manager 110. In this regard, the input source 140 may be directly connected to the system manager 110 as a peripheral device or the input source 140 may be connected to the system manager 110 through a network, such as, the Internet.

The agents 410a-410n may output determinations of how the actuators 120a-120n are to be manipulated to an output 150, which may comprise a display, a printer, a memory, the Internet, etc. The output 150 may also comprise an alarm, audible, visual, or otherwise, to signal, for instance, that a change in the cooling medium flow is required. In addition, or alternatively, the agents 410a-410n may output control signals to manipulate the actuators 120a-120n in accordance with their manipulation determinations.

Figure 5:
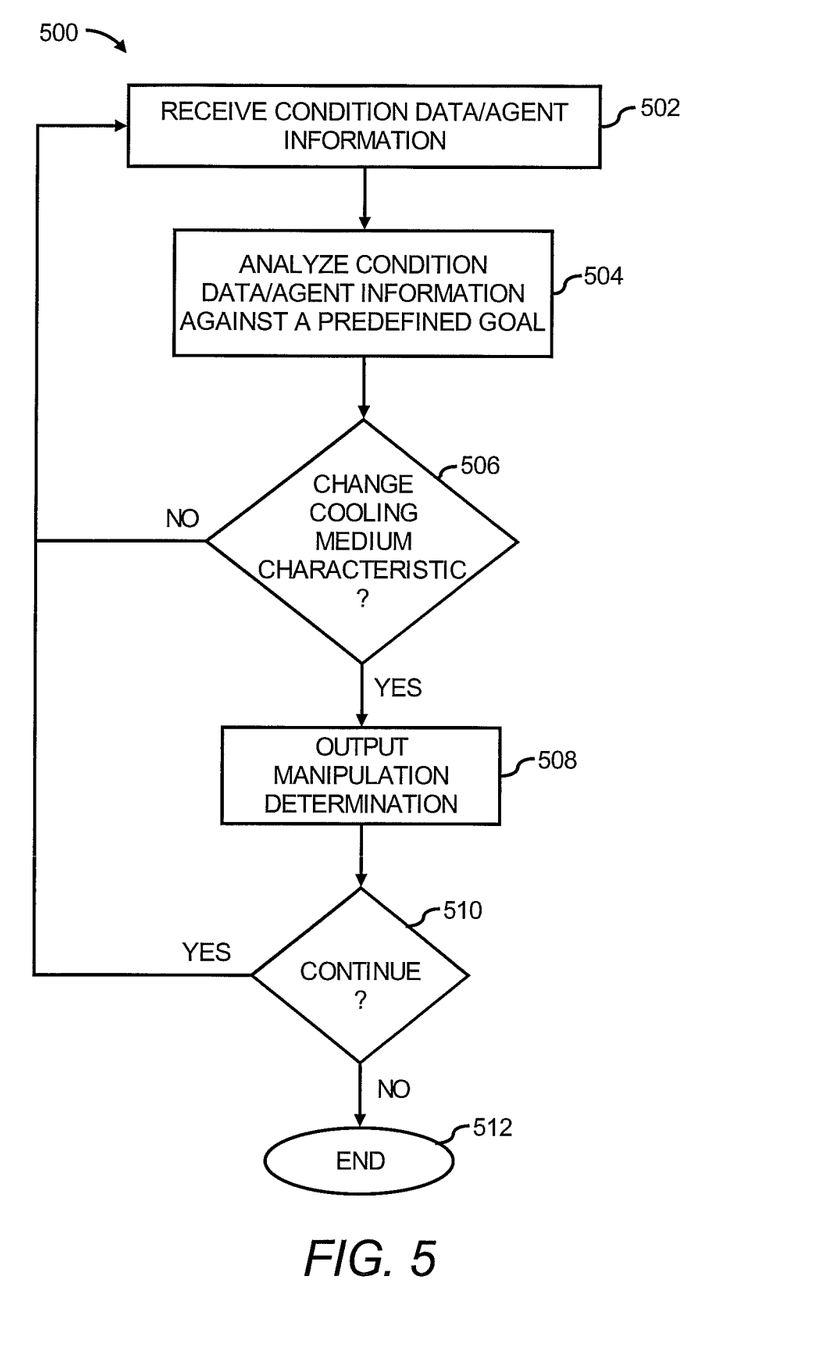
FIG. 5 shows a flow diagram of a method of managing distribution of a cooling medium to multiple areas of a structure through a network of passages having a plurality of valves positioned along the network of passages, according to an embodiment of the invention.

In any regard, various operations of the system manager 110, and the agents 410a-410n, in managing distribution of a cooling medium to one or more structures 202a-202n through a network of passages 204 are described in greater detail with respect to FIG. 5.

FIG. 5, more particularly, shows a flow diagram of a method 500 of managing distribution of a cooling medium in a network of passages for distributing the cooling medium to multiple areas in at least one structure 202a-202n, according to an example. It is to be understood that the following description of the method 500 is but one manner of a variety of different manners in which an example of the invention may be practiced. It should also be apparent to those of ordinary skill in the art that the method 500 represents a generalized illustration and that other steps may be added or existing steps may be removed, modified or rearranged without departing from a scope of the method 500.

The description of the method 500 is made with reference to the cooling medium distribution system 100 illustrated in FIG. 1 and the diagram 200 depicted in FIG. 2, and thus makes reference to the elements cited therein. It should, however, be understood that the method 500 is not limited to the elements depicted in FIGS. 1 and 2. Instead, it should be understood that the method 500 may be practiced by a system having a different configuration than that set forth in the cooling medium distribution system 100 and the diagram 200.

The method 500 may comprise an algorithm, program, hardware, etc. of the actuator management module 116. In this regard, the controller 112 may implement or invoke the actuator management module 116 in performing the method 500 to manage distribution of the cooling medium in the network of passages 204. In addition, or alternatively, the method 500 may be stored individually as algorithms, programs, hardware, etc. of the agents 410a-410n and may be implemented or invoked by respective ones of the agents 410a-410n in managing the distribution of the cooling medium and thus conditions in and/or around various areas of the one or more structures 202a-202n.

The method 500 may also be employed by a controller (not shown) of the cooling apparatus 206, such as a cooling apparatus agent 410n-1 configured to vary operations of one or more components, such as, compressors, water chillers, fans, blowers, pumps, etc., for cooling the cooling medium. In addition, the cooling apparatus agent 410n-1 may be configured to manage the cooling apparatus 206 according to one or more control policies. By way of particular example, the cooling apparatus agent 410n-1 may be configured to vary the amount of heat removed from the cooling medium in accordance with a total cost of ownership policy designed to substantially minimize costs associated with supplying cooling medium to the structures 202a-202n. Thus, for instance, the cooling apparatus agent 410n-1 may operate to determine the highest allowable temperature for the cooling medium based upon, for instance, information received from one or more of the agents 410a-410n.

As an initial step in the method 500, the system manager 110 may receive instructions from the input source 140 regarding the predefined goals that the agents 410a-410n are to operate towards achieving. As discussed above, the predefined goals may include one or more goals, such as, for instance, total cost of ownership goals, workload performance goals, sustainability goals, etc. In addition, the predefined goals may differ between one or more of the agents 410a-410n, either in the same level or in different levels.

At step 502, the controller 112 receives condition information from one or more of the sensors 130a-130n. In addition, or alternatively, the agents 410a-410n receive information from one or more other agents 410a-410n. By way of example, and as discussed above with respect to FIG. 4, the server agents 410a may receive condition data from the sensors 130a-130n and the other agents 410b-410n may receive data from agents 410a-410n arranged at least one level below the other agents 410b-410n pertaining to control decisions made by the agents 410a-410n.

At step 504, the controller 112 and/or the agents 410a-410n are configured to analyze the condition data and/or the information received from one or more of the other agents 410a-410n against at least one predefined goal. More particularly, for instance, at step 504, the controller 112 and/or the agents 410a-410n are configured to determine whether at least one goal is substantially being met based upon the condition data/agent information received at step 502.

By way of example where the at least one predefined goal comprises a total cost of ownership (TCO) goal, the agents 410a-410n may determine whether the cooling supplied from the cooling medium may be reduced while maintaining, for instance, adequate cooling to their respective areas. In this example, the controller 112 and/or the agents 410a-410n may utilize metrics such as coefficient of performance of the ensemble ($COP_G$) to substantially minimize energy consumption of the cooling apparatus 206, by increasing the temperature of the cooling medium supplied to the respective areas. In addition, the controller 112 and/or the agents 410a-410n may have the ability to "cap" power drawn by the servers 224, thus resulting in lower requirements from the server agents 410a if the cooling capacity cannot be availed at a given TCO level. Moreover, the ability to "cap" the power drawn by the servers 224 also enables uptime to substantially be maintained without requiring that a relatively large number of redundancies be built into the cooling medium distribution system 100.

According to another example, the at least one predefined goal comprises a flow/load balanced goal. Under this goal, the agents 410a-410n are configured to determine how the actuators 120a-120n are to be manipulated according to the flow/capacity requirements of the components served by the areas of the network of passages respectively associated with the valves 210a-210n/pumps 212. Thus, for instance, the agents 410a-410n may determine that one or more of the actuators 120a-120n are to be manipulated to substantially meet predefined component or branch temperature drop thresholds.

As another example, in instances where the sensors 130a-130n comprise mass flow sensors, the agents 410a-410n may determine that one or more of the actuators 120a-120n are to be adjusted based on estimated sensible heat load. In this example, information from each of the flow elements, such as, components to be cooled, branches of the passage network 206, etc., may be added together to determine the flow/load requirement for the individual actuators 120a-120n.

According to a further example, the at least one predefined goal comprises a pressure balanced goal. Under this goal, the sensors 130a-130n are configured to measure the pressure of the cooling medium at various locations in the passage network 204 and the agents 410a-410n are configured to determine how the actuators 120a-120n are to be manipulated according to static pressure measurements downstream of the valves 210a-210n/pumps 212. In addition, for instance, the actuators 120d and 120e may manipulate valves 210d, 210e under the flow/load balanced goal discussed above and the actuators 120a-120c located upstream of those actuators 120d and 120e are modulated to substantially maintain a constant static pressure downstream of the actuators 120a-120c.

According to a further example, the at least one predefined goal comprises a TCO aware goal. Under the TCO aware goal, the agents 410a-410n are configured to determine how the actuators 120a-120n are to be manipulated to substantially maintain thermal management objectives, while substantially minimizing energy consumed by various components of the cooling medium distribution system 100, such as, pumps, chillers, fans, blowers, etc. By way of example, the TCO aware goal is configured to substantially minimize chiller compressor power at the expense of other components in the cooling medium distribution system 100, since the chiller compressor typically consumes the greatest amount of power in a chiller system. In this example, as the cooling medium temperature is increased, the agents 410a-410n may increase the cooling medium mass flow rates to compensate for the increased cooling medium temperature. In addition, the cooling medium temperature may incrementally be increased until the branch fluid flows can no longer be increased, for instance, through actuators 120a-120n or due to reaching pre-set pumping thresholds, to meet the demand. As the demand is decreased, the cooling medium temperature may be further increased and as the demand is increased, the cooling medium temperature may be further decreased.

According to a further example, the at least one predefined goal comprises a workload-based goal. Under this goal, a hybrid of air-cooled and liquid-cooled architectures are utilized to cool various areas in the structures 202a-202n. The air-cooled architectures may include architectures in which airflow cooled by the cooling medium is supplied to heat generating components, such as, servers, power supplies, switches, processors, etc., housed in the racks 220. The liquid-cooled architectures may include architectures in which the heat generating components are directly cooled by the cooling medium, through, for instance, cold plates through which the cooling medium flows. By way of example, those components, such as, racks 220, servers 224, components within the servers 224, etc., that are employed to perform relatively higher-workloads or relatively more critical workloads are provisioned with additional liquid cooling, while the remaining components are cooled by the air-cooled architecture. Likewise, workload placement decisions may be made according to whether the components are provisioned with liquid cooling, such as, by placing higher heat load jobs on the components that are provisioned with liquid cooling. Moreover, the workload-based goal may be implemented in conjunction with either or both of the flow/load balanced goal and the pressure balanced goal and the agents 410a-410n may make manipulation determinations based upon the total workload placed on each of the components.

According to a further example, the at least one predefined goal comprises a sustainability aware goal. Under this goal, the agents 410a-410n seek to substantially maximize the environmental sustainability of the structures 202a-202n. By way of example, information from the agents 410a-410n may be aggregated to calculate the total infrastructure exergy loss and the agents 410a-410n may determine how the actuators 120a-120n are to be manipulated to substantially minimize the total infrastructure exergy loss value. A more detailed description of various manners in which exergy is calculated and substantially minimized is provided in commonly assigned PCT Application Serial No. US08/57040.

As part of the analysis at step 504, the controller 112 and/or the agents 410a-410n are configured to determine whether the condition data and/or the agent 410a-410n information warrant a change in a characteristic of the cooling medium, as indicated at step 506.

The change in a characteristic of the cooling medium may include, for instance, the volume flow rate of the cooling medium through a section of the network of passages 204 and/or the temperature of the cooling medium. Thus, for instance, the agents 410a-410n may determine that a change in the flow rate of the cooling medium controlled by one or more of the actuators 120a-12n is desired at step 506. In addition, or alternatively, a cooling apparatus agent 410n-1 may determine that a change in the temperature of the cooling medium is desired at step 506.

For those agents 410a-410n that determine that the cooling medium characteristic over which they have control is not to be changed, those agents 410a-410n may continue to receive and analyze data as discussed above with respect to steps 502 and 504.

For those agents 410a-410n that determine that the cooling medium characteristic over which they have control is to be changed, those agents 410a-410n are configured to output the indication that the cooling medium characteristic is to be changed, as indicated at step 508. The outputted indication at step 508 may include instructions on how the one or more of the actuators 120a-120n and/or the cooling apparatus 206 are to be manipulated to substantially achieve the at least one predefined goal.

The indication of the manipulation determination may be outputted to an output 150, such as, a display, a computing device, an alarm, a printer, etc., to, for instance, notify a user of the manipulation determination, in one or more manners. In addition, or alternatively, the indication of the manipulation determination may be communicated to a functional module operating in a computing device, to thereby cause one or more actuators 120a-120n to control the valves 210a-210n in the manners determined at step 506. In the case of the cooling apparatus agent 410n-1, the indication of the manipulation determination may be communicated to one or more actuators of the cooling apparatus 206 to thus control the temperature of the cooling medium in the manners determined at step 506.

At step 508, the controller 112 and/or the agents 410a-410n may determine whether to continue the method 500. The controller 112 and/or the agents 410a-410n may be programmed to perform the method 500 for a predetermined length of time, for a predetermined number of iterations, until certain predetermined criteria are satisfied, until manually discontinued, etc. In addition, the controller 112 and/or the agents 410a-410n may be programmed to discontinue performance of the method 500 following the same schedule or following different schedules. In this regard, one or more of the agents 410a-410n may be programmed to continue performing the method 500 while others are programmed to stop.

In any event, the agents 410a-410n may continue to perform steps 502-510 until they reach an "end" condition at step 510. Once reached, the controller 112 and/or the agents 410a-410n are configured to end implementation of the method 500 at step 512.

Some or all of the operations set forth in the method 500 may be contained as at least one utility, program, or subprogram, in any desired computer accessible medium. In addition, some or all of the steps in the method 500 may be embodied by a computer program, which may exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 6:
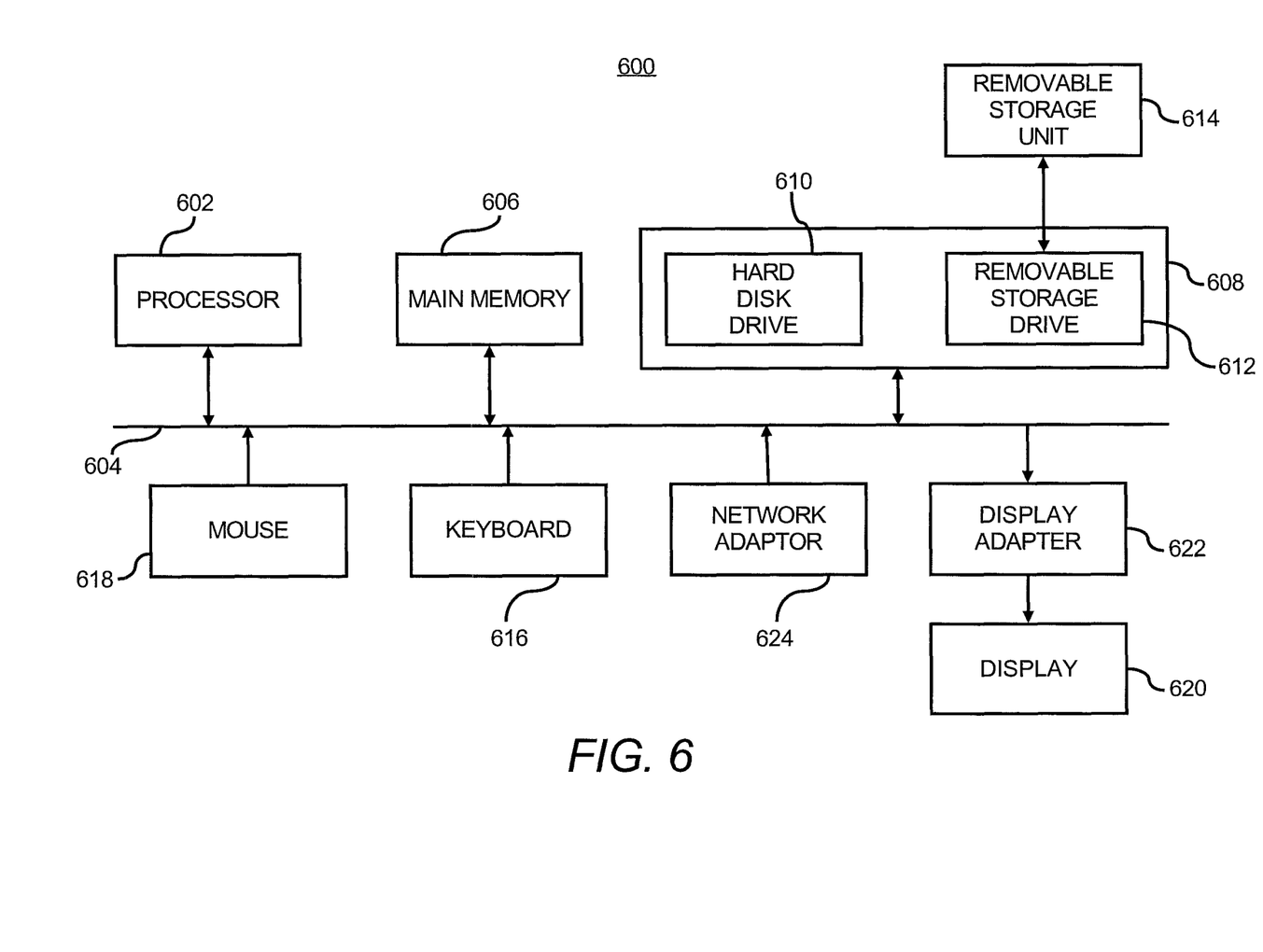
FIG. 6 illustrates a computer system, which may be employed to perform various functions of a system manager, according to an embodiment of the invention.

FIG. 6 illustrates a computer system 600, which may be employed to perform the various functions of system manager 110 described herein above, according to an example. In this respect, the computer system 600 may be used as a platform for executing one or more of the functions described hereinabove with respect to the system manager 110.

The computer system 600 includes a processor 602, which may be used to execute some or all of the steps described in the method 500. Commands and data from the processor 602 are communicated over a communication bus 604. The computer system 600 also includes a main memory 606, such as a random access memory (RAM), where the program code for, for instance, the system manager 110, may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for managing distribution of a cooling medium in a network of passages may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, for instance, the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for managing distribution of a cooling medium to multiple areas of a structure through a network of passages having a plurality of actuators positioned along the network of passages, said system comprising:
   a sensor to detect a condition;
   a first agent at a first hierarchical level, the first agent to receive the detected condition from the sensor and to determine whether a characteristic of the cooling medium controlled by a first actuator of the plurality of actuators is to be manipulated based upon the detected condition; and
   a second agent at a second hierarchical level that is higher than the first hierarchical level, wherein the second agent is to receive the characteristic manipulation determination of the first actuator made by the first agent and to determine whether a characteristic of the cooling medium controlled by a second actuator of the plurality of actuators is to be manipulated based upon the characteristic manipulation determination made by the first agent, wherein the second actuator is to control a characteristic of cooling medium flow supplied to a plurality of the first actuators; and
   a third agent at a third hierarchical level that is higher than the second hierarchical level, wherein the third agent is to receive data pertaining to at least one of the detected condition, the characteristic manipulation determination made by the first agent, and the characteristic manipulation determination made by the second agent, and to determine whether a characteristic of the cooling medium controlled by a third actuator to control a characteristic of cooling medium supplied to a plurality of second actuators is to be manipulated based upon the data received by the third agent.

2. The system according to claim 1, wherein the first agent and the second agent comprise elements to perceive an environment of at least one area in the structure based upon data pertaining to the condition detected by the sensor and to manage the environment of the at least one area through manipulation of the cooling medium characteristic.

3. The system according to claim 1, wherein the second actuator is positioned to control a cooling medium characteristic upstream of the first actuator along the network of passages and wherein the first agent and the second agent are to meet a predefined goal, wherein the first agent is further to determine whether the characteristic of the cooling medium controlled by the first actuator is to be manipulated based upon whether the predefined goal is substantially being met, and wherein the second agent is further to determine whether the characteristic of the cooling medium controlled by the second actuator is to be manipulated based upon whether the predefined goal is being met.

4. The system according to claim 3, wherein the predefined goal comprises at least one of a total cost of ownership goal, a flow/load balanced goal, a pressure balanced goal, a total cost of ownership aware goal, a workload-based goal, and a sustainability aware goal.

5. The system according to claim 1, further comprising:
   a cooling apparatus to cool the cooling medium; and
   a cooling apparatus agent to determine whether a component of the cooling apparatus is to be manipulated according to a predefined goal, wherein the cooling apparatus agent is to receive and to further analyze at least one of the detected condition, the characteristic manipulation determination of the first actuator, and the characteristic manipulation determination of the second actuator in determining whether to manipulate the component of the cooling apparatus according to the predefined goal.

6. The system according to claim 1, wherein a branch of the network of passages is positioned to at least one of cool airflow supplied into at least one server of the plurality of servers and a component contained in the at least one server, and wherein the first actuator controls cooling medium flow into the at least one server and the second actuator controls cooling medium flow to the first actuator.

7. A method of managing distribution of a cooling medium to multiple areas of a structure through a network of passages having a plurality of actuators positioned along the network of passages, said method comprising:
   in a first agent at a first hierarchical level,
      receiving data pertaining to a condition detected by a sensor, and
      determining, by at least one processor, whether a characteristic of the cooling medium controlled by a first actuator of the plurality of actuators is to be manipulated based upon the data received by the first agent;
   in a second agent at a second hierarchical level that is higher than the first hierarchical level,
      receiving data pertaining to the cooling medium characteristic manipulation determination of the first actuator made by the first agent, and
      determining whether a second actuator of the plurality of actuators is to be manipulated based upon the data received by the second agent, the second actuator controlling a characteristic of cooling medium flow supplied to a plurality of the first actuators; and
   in a third agent at a third hierarchical level that is higher than the second hierarchical level,
      receiving at least one of the data pertaining to the detected condition, the characteristic manipulation determination made by the first agent, and the characteristic manipulation determination made by the second agent, and
      determining whether a third actuator of the plurality of actuators is to be manipulated based upon the data received by the third agent, the third actuator controlling a characteristic of cooling medium supplied to a plurality of the second actuators.

8. The method according to claim 7, wherein determining whether the characteristic of the cooling medium controlled by the first actuator is to be manipulated further comprises determining that the characteristic of the cooling medium controlled by the first actuator is to be manipulated in response to the at least one of the data pertaining to the detected condition and the data pertaining to the cooling medium characteristic manipulation determination of the first actuator made by the first agent indicating that a predefined goal is not being met.

9. The method according to claim 7, further comprising outputting to a user an indication that at least one of the first actuator and the second actuator is to manipulate a characteristic of the cooling medium.

10. The method according to claim 7, further comprising:
in a cooling apparatus agent,
receiving at least one of data pertaining to a condition detected by another sensor and data pertaining to a cooling medium characteristic manipulation determination by another agent, and
determining whether the characteristic of the cooling medium is to be manipulated based upon the at least one of the data pertaining to the detected condition by the another sensor and the data pertaining to the cooling medium characteristic manipulation determination made by the another agent.

11. The method according to claim 10, wherein determining whether the characteristic of the cooling medium is to be manipulated further comprises determining that the characteristic is to be manipulated in response to the at least one of the data pertaining to the detected condition and the data pertaining to the cooling medium characteristic manipulation determination indicating that a predefined goal is not being met.

12. The method according to claim 7,
wherein determining whether to manipulate the characteristic of the cooling medium controlled by the first actuator is further based upon a first predefined goal, and
wherein determining whether to manipulate the characteristic of the cooling medium controlled by the second-actuator is further based upon a second predefined goal.

13. A non-transitory computer readable medium comprising machine readable instructions for managing distribution of a cooling medium to multiple areas of a structure through a network of passages having a plurality of actuators positioned along the network of passages, the machine readable instructions, when executed by a processor, cause the processor to:
in a first agent at a first hierarchical level,
receive data pertaining to a condition detected by a sensor, and
determine whether a characteristic of the cooling medium controlled by a first actuator of the plurality of actuators is to be manipulated based upon the data received by the first agent;
in a second agent at a second hierarchical level that is higher than the first hierarchical level,
receive data pertaining to the cooling medium characteristic manipulation determination of the first actuator made by the first agent, and
determine whether a second actuator of the plurality of actuators is to be manipulated based upon the data received by the second agent, the second actuator to control a characteristic of cooling medium flow supplied to a plurality of the first actuators; and
in a third agent at a third hierarchical level that is higher than the second hierarchical level,
receive at least one of the data pertaining to the detected condition, the characteristic manipulation determination made by the first agent, and the characteristic manipulation determination made by the second agent, and
determine whether a third actuator of the plurality of actuators is to be manipulated based upon the data received by the third agent, the third actuator to control a characteristic of cooling medium supplied to a plurality of the second actuators.

* * * * *